United States Patent
Mansor et al.

(10) Patent No.: US 12,426,417 B2
(45) Date of Patent: Sep. 23, 2025

(54) OPTOELECTRONIC DEVICE WITH LIGHT EMITTER AND DETECTOR AND METHOD FOR MANUFACTURING AN OPTOELECTRONIC DEVICE

(71) Applicant: OSRAM Opto Semiconductors GmbH, Regensburg (DE)

(72) Inventors: Mazwan Mansor, Alor Setar (MY); Ismail Ithnain, Bayan Lepas (MY); Mohd Fauzi Zainordin, Bayan Lepas (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 598 days.

(21) Appl. No.: 17/638,210

(22) PCT Filed: Aug. 29, 2019

(86) PCT No.: PCT/EP2019/073151
§ 371 (c)(1),
(2) Date: Feb. 25, 2022

(87) PCT Pub. No.: WO2021/037371
PCT Pub. Date: Mar. 4, 2021

(65) Prior Publication Data
US 2022/0293837 A1    Sep. 15, 2022

(51) Int. Cl.
*H10H 20/857*    (2025.01)
*H01L 25/16*    (2023.01)
*H10H 20/01*    (2025.01)

(52) U.S. Cl.
CPC ......... *H10H 20/857* (2025.01); *H01L 25/167* (2013.01); *H10H 20/01* (2025.01); *H10H 20/0364* (2025.01)

(58) Field of Classification Search
CPC ..... H01L 33/62; H01L 25/167; H01L 33/005; H01L 2933/0066; H01L 33/486; H10H 20/857; H10H 20/01; H10H 20/0364; H10H 20/8506
See application file for complete search history.

(56) References Cited

U.S. PATENT DOCUMENTS

| | | |
|---|---|---|
| 2011/0140284 A1 | 6/2011 | Günther et al. |
| 2015/0057511 A1 | 2/2015 | Basu |
| 2015/0091182 A1* | 4/2015 | Chiu ...................... H01L 24/19 438/126 |
| 2016/0029911 A1 | 2/2016 | Lee |

(Continued)

OTHER PUBLICATIONS

European office action issued for the corresponding European patent application No. 19766196.0, dated Jun. 28, 2024, 5 pages (for informational purposes only).

(Continued)

*Primary Examiner* — Syed I Gheyas
(74) *Attorney, Agent, or Firm* — VIERING, JENTSCHURA & PARTNER mbB

(57) ABSTRACT

An optoelectronic device may include a semiconductor chip, a first redistribution layer arranged over the semiconductor chip, and at least one light emitter and at least one light detector arranged over the first redistribution layer. The first redistribution layer may electrically couple the semiconductor chip to the light emitter(s) and the light detector(s).

14 Claims, 3 Drawing Sheets

(56) References Cited

U.S. PATENT DOCUMENTS

| | | | |
|---|---|---|---|
| 2017/0207208 A1* | 7/2017 | Chen | H01L 23/3114 |
| 2018/0303359 A1 | 10/2018 | O'Brien et al. | |
| 2018/0337142 A1* | 11/2018 | Cheng | H01L 23/04 |
| 2020/0219878 A1* | 7/2020 | Then | H01L 29/7786 |

OTHER PUBLICATIONS

International Search Report for corresponding Application PCT/EP2019/073151, dated May 26, 2020, 3 pages (for Informational purpose only).

* cited by examiner

OPTOELECTRONIC DEVICE WITH LIGHT EMITTER AND DETECTOR AND METHOD FOR MANUFACTURING AN OPTOELECTRONIC DEVICE

CROSS-REFERENCE TO RELATED APPLICATIONS

The present application is a national stage entry according to 35 U.S.C. §371 of PCT application No.: PCT/EP2019/073151 filed on Aug. 29, 2019, which is incorporated herein by reference in its entirety and for all purposes.

TECHNICAL FIELD

The disclosure concerns an optoelectronic device comprising a light emitter and a light detector as well as a method for manufacturing an optoelectronic device.

BACKGROUND

Optoelectronic devices can be used as sensors to measure the heartbeat or other vital signs of humans or animals. The design of conventional health sensors is often bulky. In addition, many bond wires are used in conventional sensors and emitters to electrically couple the components of the sensors and emitters, which increases the production costs.

It is an underlying object to provide an optoelectronic device with smaller package dimensions and reduced production costs compared to conventional optoelectronic devices. It is further an object to provide a portable electronic device comprising the optoelectronic device. In addition, it is an object to provide a method for manufacturing the optoelectronic device.

SUMMARY

An optoelectronic device according to an embodiment comprises a semiconductor chip, a first redistribution layer, at least one light emitter and at least one light detector.

The first redistribution layer is arranged over the semiconductor chip, which may comprise an integrated circuit as explained below. The at least one light emitter and the at least one light detector are arranged over the first redistribution layer. The first redistribution layer electrically couples the semiconductor chip to the at least one light emitter and the at least one light detector.

The at least one light emitter is configured to emit light during the operation of the optoelectronic device. At least a portion of the emitted light can be detected by the at least one light detector. A portion of the emitted light may also be absorbed by the environment of the optoelectronic device. For example, the optoelectronic device may be configured as a vital sign sensor. In this case, the at least one light emitter emits light towards the skin of a human or an animal. The emitted light is partially absorbed by the blood of the human or animal. The light detected by the at least one light detector can be used to measure one or more vital sign parameters, for example, the heartbeat, the heart rate, the heart frequency, the pulse rate and/or the oxygen saturation in the blood of the human or the animal. Other applications of the optoelectronic device are also possible.

The at least one light emitter may be a semiconductor chip that is configured to emit light. For example, the at least one light emitter may be a light emitting diode (LED). The LED may emit light of a certain wavelength or within a certain range of wavelengths. The LED may, for example, emit visible light or infrared (IR) light or ultraviolet (UV) light.

Further, the optoelectronic may comprise two or more light emitters. The two or more light emitters may be configured to emit light of different wavelengths. For example, the optoelectronic device may comprise one or more light emitters emitting red light, one or more light emitters emitting green light and one or more light emitters emitting infrared light.

The at least one light detector may be a semiconductor chip that is configured to detect light. For example, the at least one light detector may be a photodiode.

The semiconductor chip may comprise an integrated circuit (IC) and may be configured to control the at least one light emitter and/or the at least one light detector. Additionally or alternatively, the semiconductor chip may be configured to evaluate signals received from the at least one light detector. For example, the semiconductor chip may calculate vital sign parameters from the signals received from the at least one light detector.

The first redistribution layer may comprise one or more electrically conductive layers that are applied to the at least one light emitter, the at least one light detector and the semiconductor chip. The electrically conductive layers may be connected to contact pads of the at least one light emitter, the at least one light detector and the semiconductor chip. The electrically conductive layers may be used to make electrical contact with the at least one light emitter, the at least one light detector and the semiconductor chip from outside the optoelectronic device and make electrical connections within the optoelectronic device. The electrically conductive layers electrically couple the at least one light emitter and the at least one light detector to the semiconductor chip. The electrically conductive layers may be manufactured with any desired geometric shape and any desired material composition. For example, the electrically conductive layers may be composed of linear conductor tracks or may be in the form of a layer covering an area. Any suitable electrically conductive material, for example, aluminum, gold, copper or other metals, may be used as the material of the electrically conductive layers. The electrically conductive layers may be arranged above or below or between dielectric layers that are electrically insulating.

The optoelectronic device can be manufactured with smaller package dimensions and reduced production costs compared to conventional optoelectronic devices. In particular, no wire bond process is needed for manufacturing the optoelectronic device. Further, the package speed, the detection speed and the electromagnetic interference (EMI) robustness are higher compared to conventional optoelectronic devices.

In one embodiment, each of the at least one light emitter and the at least one light detector has a first main surface and a second main surface opposite to the first main surface. Side surfaces extend from the first main surface to the respective second main surface. Further, the first main surfaces of the at least one light emitter and the at least one light detector are arranged in a common plane. The at least one light emitter may emit light through the first main surface. Further, the light detected by the at least one light detector may enter the at least one light detector through the first main surface.

An electrically insulating material may cover the at least one light emitter and the at least one light detector such that the first surfaces of the at least one light emitter and the at least one light detector are exposed from the electrically insulating material. The electrically insulating material may cover the second main surfaces and the side surfaces of the at least one light emitter and the at least one light detector.

The redistribution layer may be applied to the electrically insulating material. The electrically insulating material allows the redistribution layer to extend to an area outside the outlines of the at least one light emitter and the at least one light detector thus creating a fan-out redistribution layer.

The electrically insulating material may be a mold material or an epoxy-based material. In case the electrically insulating material is a mold material, it may be, for example, an appropriate thermoplastic or thermosetting material. Various techniques may be employed to cover the at least one light emitter and the at least one light detector with the mold material, for example, compression molding or injection molding.

The optoelectronic device may comprise a second redistribution layer extending from the first redistribution layer to an assembly surface of the optoelectronic device. Further, the second redistribution layer may be electrically coupled to the first redistribution layer. The assembly surface may serve to mount the optoelectronic device onto another component, such as a circuit board for example.

At least portions of the second redistribution layer, in particular surfaces of the second redistribution layer, may form external contact pads on the assembly surface. The external contact pads are accessible from outside of the optoelectronic device and allow electrical contact to be made with the electrical components of the optoelectronic device from outside of the optoelectronic device.

The optoelectronic device may further comprise a third redistribution layer that is arranged over the at least one light emitter and the at least one light detector. The third redistribution layer may be electrically coupled to the at least one light emitter and the at least one light detector.

The optoelectronic device may be an optoelectronic sensor, for example, a vital sign sensor. The optoelectronic device may be configured to measure a heartbeat, a heart frequency, a pulse, an oxygen saturation of blood and/or other vital sign parameters of a human and/or an animal.

A portable electronic device according to an embodiment comprises an optoelectronic device as described above. The portable electronic device may be a wearable, also known as wearable computer or body-borne computer. A wearable is a small electronic or computing device that is worn under, with or on top of clothing. The wearable may, for example, be a smartwatch, a head-mounted display, an activity tracker or a fitness tracker.

The optoelectronic device can be integrated into the portable electronic device such that the at least one light emitter emits light in the direction to the skin of a user.

Further, the optoelectronic device may also be integrated into a medical device.

A method for manufacturing an optoelectronic device comprises providing at least one light emitter and at least one light detector, applying a first redistribution layer to the at least one light emitter and the at least one light detector, and placing a semiconductor chip on the first redistribution layer. The first redistribution layer electrically couples the semiconductor chip to the at least one light emitter and the at least one light detector.

The method for manufacturing an optoelectronic device may comprise the embodiments described above in connection with the optoelectronic device.

The at least one light emitter and the at least one light detector may be placed on a temporarily carrier before the first redistribution layer is applied. The distance between the at least one light emitter and the at least one light detector can be chosen freely. After the semiconductor chip has been placed on the first redistribution layer, the temporarily carrier may be removed from the at least one light emitter and the at least one light detector. This does not mean that the temporarily carrier is necessarily removed immediately after the semiconductor chip has been placed on the first redistribution layer.

There can be other manufacturing steps following the placement of the semiconductor chip on the first redistribution layer before the temporarily carrier is removed. It may be provided that the temporarily carrier is removed after a second redistribution layer has been produced as explained below.

The at least one light emitter and the at least one light detector may be covered with an electrically insulating material after they have been placed on the carrier. Further, the first redistribution layer may be applied to the electrically insulating material.

The electrically insulating material, which may be a mold material, forms an artificial wafer. The gaps and edges around the at least one light emitter and the at least one light detector may be filled with the electrically insulating material.

Embedded wafer level ball grid array (eWLB) technology may be used to manufacture the optoelectronic device.

The semiconductor chip may be also covered with an electrically insulating material. Further, a second redistribution layer may be applied to the electrically insulating material that covers the semiconductor chip. The second redistribution layer may be electrically coupled to the first redistribution layer.

Portions of the second redistribution layer may form external contact pads.

A third redistribution layer may be applied to the at least one light emitter and the at least one light detector after the at least one light emitter and the at least one light detector have been removed from the carrier. The third redistribution layer may be applied to the surface of the optoelectronic device that has been uncovered by the removal of the carrier.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures. There are shown in the drawings.

DETAILED DESCRIPTION

Figure 1A:
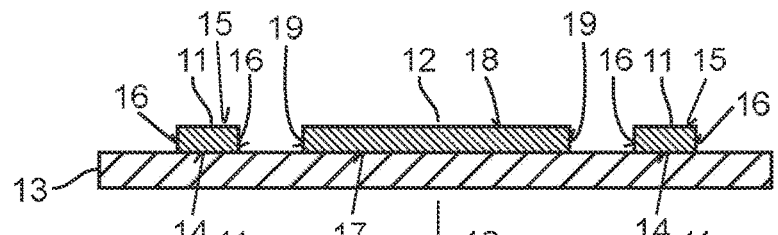
FIGS. 1A to 1P schematic representations of an exemplary embodiment of a method for manufacturing an optoelectronic device.
Figure 1B:
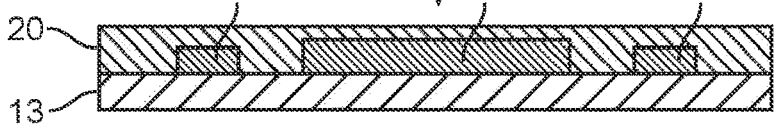
Figure 1C:
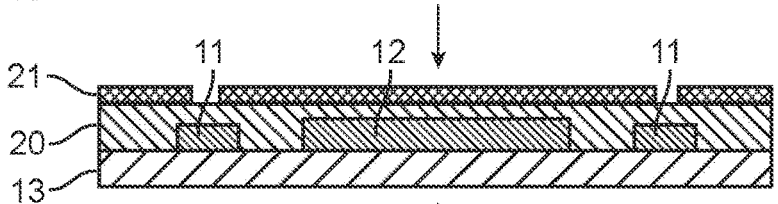
Figure 1D:
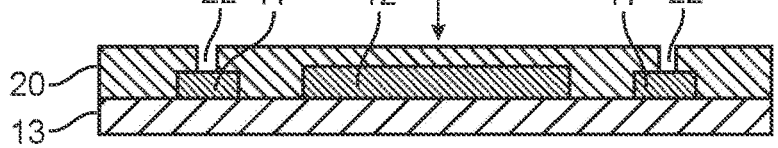
Figure 1E:
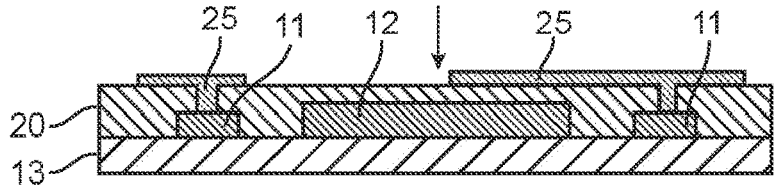
Figure 1F:
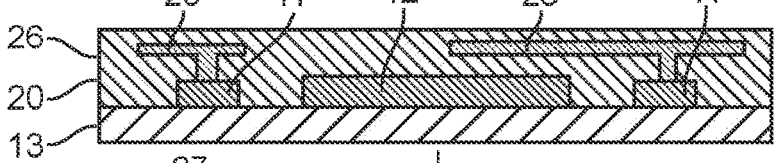
Figure 1G:
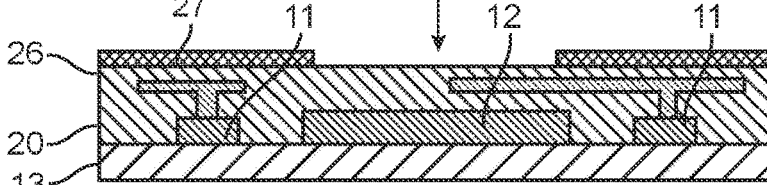
Figure 1H:
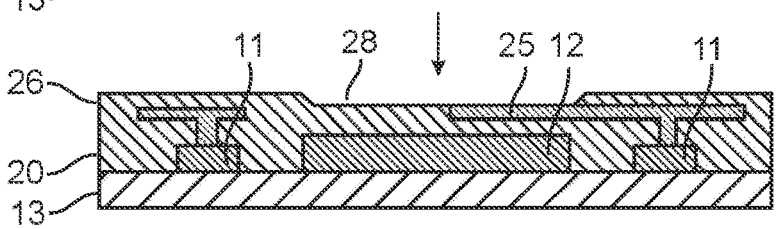
Figure 1I:
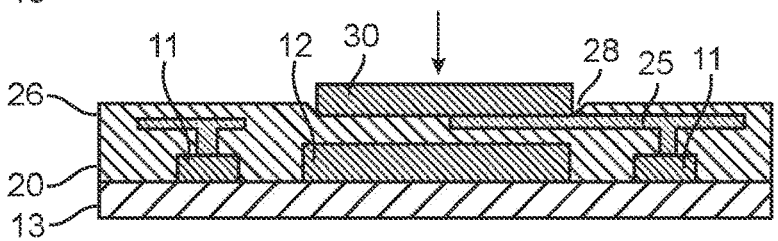
Figure 1J:
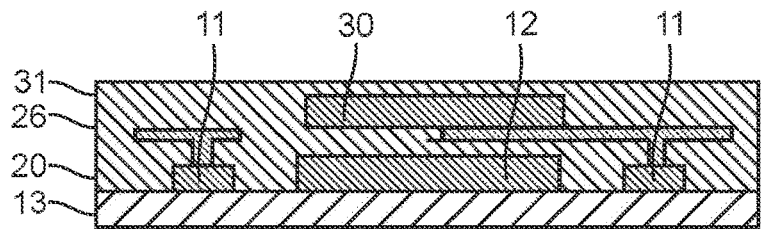
Figure 1K:
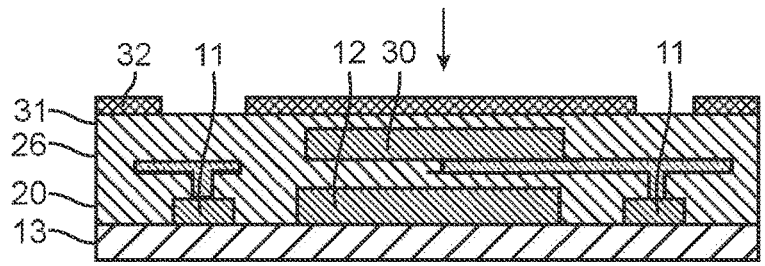
Figure 1L:
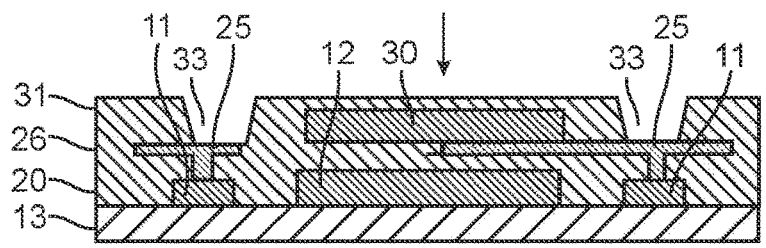
Figure 1M:
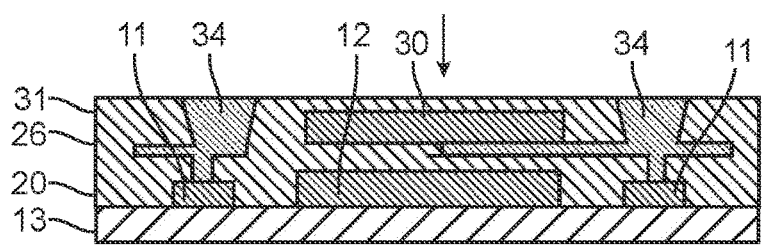
Figure 1N:
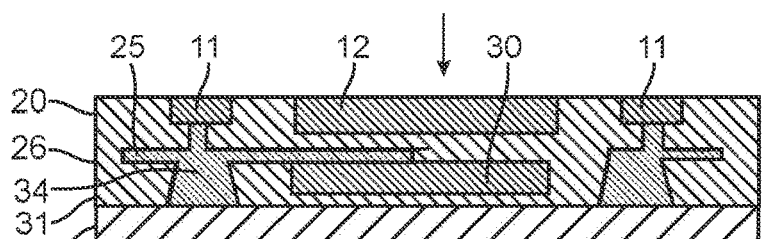
Figure 1O:
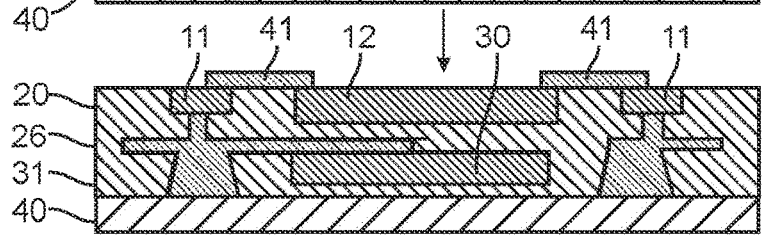
Figure 1P:
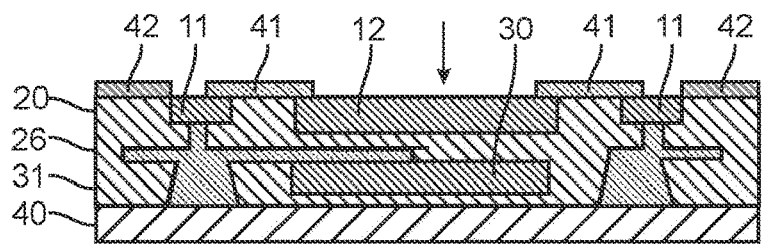

FIGS. 1A to 1P schematically illustrate an exemplary embodiment of a method for manufacturing an optoelectronic device.

FIG. 1A shows two light emitters 11 and a light detector 12. The light emitters 11 and the light detector 12 have been manufactured on front-end-processed wafers, which have been diced. The singulated chips of the light emitters 11 and the light detector 12 are placed on a temporarily carrier 13 in a flip-chip configuration such that at least some of the contact pads of the light emitters 11 and the light detector 12 face away from the carrier 13.

It can be provided that more light emitters 11 and light detectors 12 than the ones shown in FIG. 1A are placed on the carrier 13. In particular, the light emitters 11 and light detectors 12 of a plurality of optoelectronic devices to be fabricated can be placed on the carrier 13.

Each of the light emitters 11 has a first main surface 14 and a second main surface 15 opposite to the first main surface 14 as well as side surfaces 16 extending from the first main surface 14 to the second main surface 15. The light detector 12 has a first main surface 17 and a second main surface 18 opposite to the first main surface 17 as well as side surfaces 19 extending from the first main surface 17 to the second main surface 18. The light emitters 11 and the light detector 12 are placed on the carrier 13 such that the first main surfaces 14 and 17 face the carrier 13.

In FIG. 1B a first electrically insulating material 20 is deposited on the light emitters 11 and the light detector 13. The first electrically insulating material 20 is a mold material in the present embodiment, in particular a silicon mold material. The first electrically insulating material 20 covers the second main surfaces 15, 18 and the side surfaces 16, 19 of the light emitters 11 and the light detector 12. Further, the first electrically insulating material 20 fills the gaps and edges around the light emitters 11 and the light detector 12.

The layer of the first electrically insulating material 20 is then structured. For this purpose, a first photoresist layer 21 is applied to the top surface of the first electrically insulating material 20 and is structured as illustrated in FIG. 1C.

The structuring of the first photoresist layer 21 enables a selective etching process to get access to the light emitters 11 and the light detector 12 from the upper surface of the first electrically insulating layer 20 as shown in FIG. 1D. Plasma etching, liquid etching or any other suitable etching technique may be employed for the etching process. In particular, the first electrically insulating material 20 is removed from contact pads of the light emitters 11 and the light detector 12 by creating through holes 22 over the light emitters 11 and the light detector 12 exposing the contact pads. After the etching step, the first photoresist layer 21 is removed.

In FIG. 1E, a first redistribution layer 25 is applied to the first electrically insulating material 20. The first redistribution layer 25 includes at least one electrically conductive layer that is connected to the contact pads of the light emitters 11 and the light detector 12 exposed from the first electrically insulating material 20 by the through holes 22.

In FIG. 1F, a second electrically insulating material 26, for example a silicon mold material, is deposited on the first redistribution layer 25 and the first electrically insulating material 20.

The layer of the second electrically insulating material 26 is then structured. For that, a second photoresist layer 27 is applied to the top surface of the second electrically insulating material 26 and is structured as illustrated in FIG. 1G.

A selective etching process, for example, a plasma or liquid etching process, is applied for etching the portions of the second electrically insulating material 26 that are exposed from the second photoresist layer 27. Thereby a hole 28 is created in the second electrically insulating material 26, which uncovers at least a portion of one electrically conductive layer of the first redistribution layer 25 as illustrated in FIG. 1H.

In FIG. 1I, a semiconductor chip 30 is placed in the hole 28 in a flip-chip configuration and the contact pads of the semiconductor chip 30 are connected to the first redistribution layer 25.

In FIG. 1J, the semiconductor chip 30 and the second electrically insulating material 26, are covered by a third electrically insulating material 31, which can be a silicon mold material.

In FIG. 1K, a third photoresist layer 32 is applied to the top surface of the third electrically insulating material 31 and is structured.

In FIG. 1L, the portions of the third electrically insulating material 31 exposed from the third photoresist layer 32 are etched. Thereby through holes 33 are created in the third electrically insulating material 31, which expose portions of the first redistribution layer 25. Afterwards the third photoresist layer 32 is removed.

In FIG. 1M, a second redistribution layer 34 is created. The second redistribution layer 34 is connected to the first redistribution layer 25 via the through holes 33 in the third electrically insulating material 31. Further, the second redistribution layer 34 may extend over the top surface of the third electrically insulating material 31.

The wafer made of the electrically insulating materials 20, 26 and 31 is then removed from the carrier 13. The wafer is flipped and is mounted on a temporarily carrier 40 as illustrated in FIG. 1N.

In FIG. 1O, a third redistribution layer 41 is created on the flat surface, which was previously attached to the carrier 13. The third redistribution layer 41 can electrically interconnect the light emitters 11 and the light detector 12.

In FIG. 1P, a black solder resist 42 is deposited on the exposed top surface of the first electrically insulating material 20.

In case the wafer includes several optoelectronic devices, these optoelectronic devices are separated from one another by separation of the electrically insulating materials 20, 26 and 31, for example, by sawing. Then the optoelectronic devices are released from the carrier 40.

Figure 2:
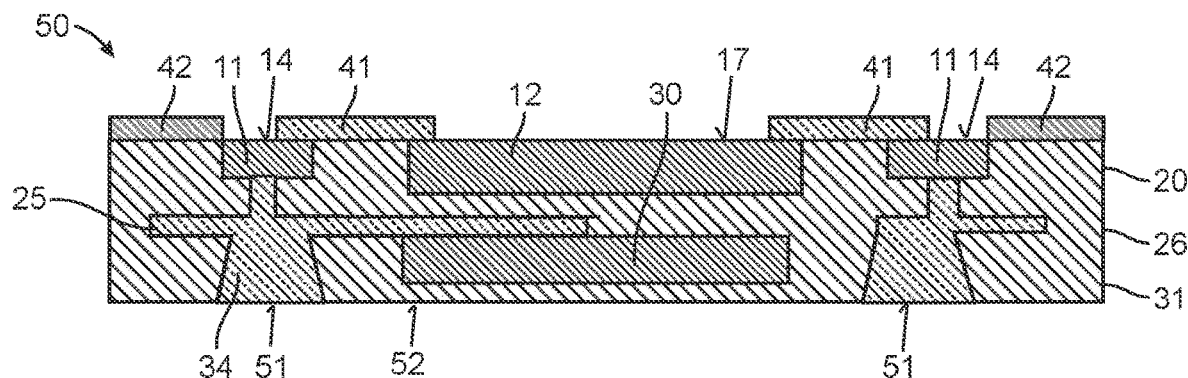
FIG. 2 a schematic representation of an exemplary embodiment of an optoelectronic device.

FIG. 2 schematically illustrates an exemplary embodiment of an optoelectronic device 50 in cross section, which was obtained from the fabrication process shown in FIG. 1A to 1P.

The first surfaces 14, 17 of the light emitters 11 and the light detector 12 are arranged in a common plane. The reason for this is that they have been placed on the flat carrier 13 in the manufacturing step shown in FIG. 1A.

The light emitters 11 emit light through their first surfaces 14. The light detector 12 receives the light emitted by the light emitters 11 through its first surface 17.

The semiconductor chip 30 is electrically coupled to the light emitters 11 and the light detector 12 via the first redistribution layer 25. During operation of the optoelectronic device 50, the semiconductor chip 30 can control the light emitters 11 and the light detector 12 and, in addition, can evaluate measurement signals provided by the light detector 12.

External contact pads 51 are formed by the second redistribution layer 34 on the bottom surface of the optoelectronic device 50. The semiconductor chip 30 and, in particular, the light emitters 11 and the light detector 12 can be contacted via the external contact pads 51.

The bottom surface of the optoelectronic device 50 forms an assembly surface 52. The assembly surface 52 may serve to mount the optoelectronic device 50 onto another component, such as a circuit board for example.

Figure 3A:
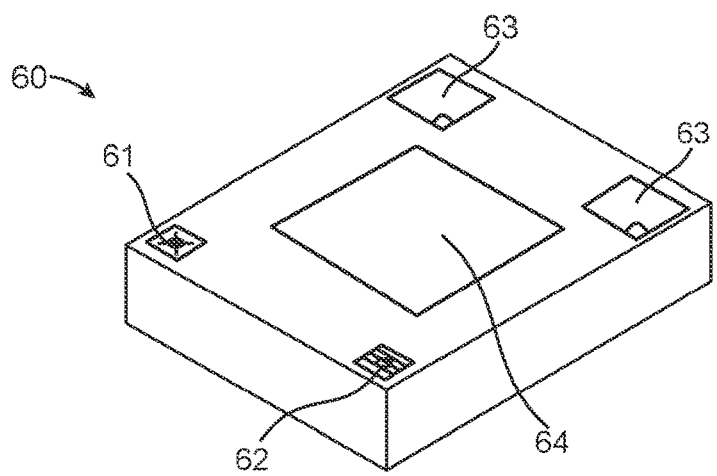
FIGS. 3A to 3C schematic representations of a further exemplary embodiment of an optoelectronic device.
Figure 3B:
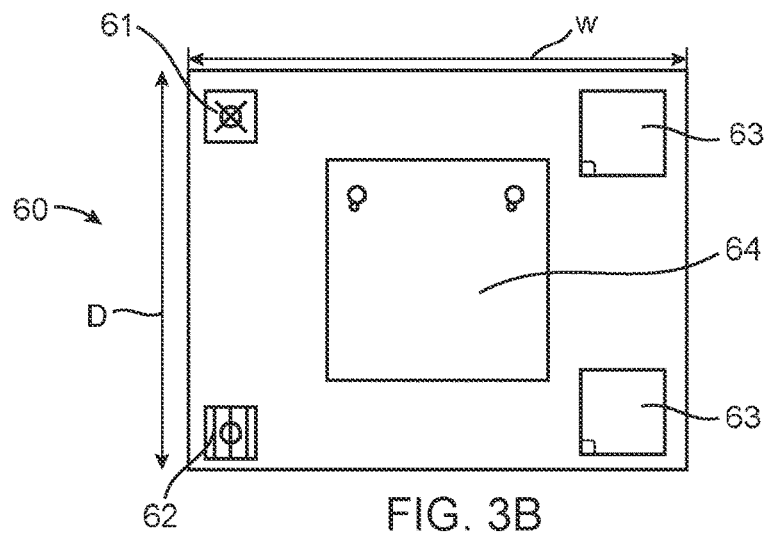
Figure 3C:

FIGS. 3A to 3C schematically illustrate an optoelectronic device 60 as a further exemplary embodiment. FIG. 3A shows a three-dimensional view of the optoelectronic device 60. FIGS. 3B and 3C show a top view and a side view of the optoelectronic device 60, respectively.

The optoelectronic device 60 includes an LED 61 emitting red light, an LED 62 emitting infrared light and two LEDs 63 emitting green light. The LEDs 61 to 63 are arranged in an array. Further, the optoelectronic device 60 includes a photodiode 64 arranged in the middle of the LED array.

The optoelectronic device 60 may have a width W of 3.0 mm, a depth D of 2.5 mm and a height H of 0.65 mm. The optoelectronic device 60 may also have other dimensions. The dimensions of the optoelectronic device 60 in particular depend on the dimensions of the semiconductor chip 30, the LEDs 61 to 63 and the photodiode 64.

LIST OF REFERENCE SIGNS 11 light emitter
12 light detector
13 carrier
14 first main surface
15 second main surface
16 side surface
17 first main surface
18 second main surface
19 side surface
20 first electrically insulating material
21 first photoresist layer
22 through hole
25 first redistribution layer
26 second electrically insulating material
27 second photoresist layer
28 hole
30 semiconductor chip
31 third electrically insulating material
32 third photoresist layer
33 through hole
34 second redistribution layer
40 carrier
41 third redistribution layer
42 black solder resist
50 optoelectronic device
51 external contact pad
52 assembly surface
60 optoelectronic device
61 LED emitting red light
62 LED emitting infrared light
63 LED emitting green light
64 5photodiode

The invention claimed is:

1. An optoelectronic device comprising:
a semiconductor chip;
a first redistribution layer arranged over the semiconductor chip;
a second redistribution layer extending to an assembly surface of the optoelectronic device;
at least one light emitter and at least one light detector arranged over the first redistribution layer; and
a third redistribution layer arranged over the at least one light emitter and the at least one light detector;
wherein:
the first redistribution layer electrically couples the semiconductor chip to the at least one light emitter and the at least one light detector, wherein the first redistribution layer directly couples the semiconductor chip to the at least one light emitter;
the second redistribution layer is electrically coupled to the first redistribution layer, wherein the second redistribution layer is directly coupled to the first redistribution layer, and
the third redistribution layer is electrically coupled to the at least one light emitter and the at least one light detector, wherein the third redistribution layer directly couples the at least one light emitter and the at least one light detector to each other.

2. The optoelectronic device as claimed in claim 1, wherein at least portions of the second redistribution layer form external contact pads.

3. The optoelectronic device as claimed in claim 1, wherein the optoelectronic device is an optoelectronic sensor.

4. A portable electronic device comprising an optoelectronic device as claimed in claim 1.

5. The optoelectronic device as claimed in claim 2, wherein the at least portions of the second redistribution layer forming the external contact pads are disposed at the assembly surface of the optoelectronic device, wherein the assembly surface is opposite an emitting and detecting surface of the optoelectronic device.

6. The optoelectronic device as claimed in claim 5, wherein the assembly surface is configured to mount the optoelectronic device onto another component.

7. The optoelectronic device as claimed in claim 1, wherein:
the first redistribution layer, the second redistribution layer, the at least one light emitter and the at least one light detector are embedded in an electrically insulating material so as to be laterally enclosed by the electrically insulating material;
each of the at least one light emitter and the at least one light detector has a first main surface and a second main surface opposite to the first main surface, wherein the first main surfaces of the at least one light emitter and the at least one light detector are exposed from the electrically insulating material; and
the third redistribution layer is disposed directly on the electrically insulating material and directly on the first main surfaces of the at least one light emitter and the at least one light detector.

8. The optoelectronic device as claimed in claim 7, wherein the first main surfaces of the at least one light emitter and the at least one light detector are arranged in a common plane.

9. A method for manufacturing an optoelectronic device, wherein the method comprises:
providing at least one light emitter and at least one light detector;
applying a first redistribution layer to the at least one light emitter and the at least one light detector, wherein the at least one light emitter and the at least one light detector are placed on a carrier before the first redistribution layer is applied to the at least one light emitter and the at least one light detector;
placing a semiconductor chip on the first redistribution layer, the semiconductor chip being covered with an electrically insulating material;
applying a second redistribution layer to the electrically insulating material covering the semiconductor chip;
removing the carrier from the at least one light emitter and the at least one light detector at a later step; and applying a third redistribution layer to the at least one light emitter and the at least one light detector after the at least one light emitter and the at least one light detector have been removed from the carrier;

wherein:

the first redistribution layer electrically couples the semiconductor chip to the at least one light emitter and the at least one light detector, wherein the first redistribution layer directly couples the semiconductor chip to the at least one light emitter;

the second redistribution layer is electrically coupled to the first redistribution layer, wherein the second redistribution layer is directly coupled to the first redistribution layer; and the third redistribution layer is electrically coupled to the at least one light emitter and the at least one light detector, wherein the third redistribution layer directly couples the at least one light emitter and the at least one light detector to each other.

10. The method as claimed in claim 9, wherein the at least one light emitter and the at least one light detector placed on the carrier are covered with an electrically insulating material; and wherein the first redistribution layer is applied to the electrically insulating material.

11. The method as claimed in claim 10, wherein the electrically insulating material is a mold material.

12. The method as claimed in claim 9, wherein portions of the second redistribution layer form external contact pads.

13. The method as claimed in claim 9, wherein:

the first redistribution layer, the second redistribution layer, the at least one light emitter and the at least one light detector are embedded in an electrically insulating material so as to be laterally enclosed by the electrically insulating material;

each of the at least one light emitter and the at least one light detector has a first main surface and a second main surface opposite to the first main surface, wherein the first main surfaces of the at least one light emitter and the at least one light detector are exposed from the electrically insulating material; and the third redistribution layer is disposed directly on the electrically insulating material and directly on the first main surfaces of the at least one light emitter and the at least one light detector.

14. The method as claimed in claim 13, wherein the first main surfaces of the at least one light emitter and the at least one light detector are arranged in a common plane.

\* \* \* \* \*